United States Patent [19]

Tircot

[11] Patent Number: 4,506,510
[45] Date of Patent: Mar. 26, 1985

[54] APPARATUS FOR CONTINUOUSLY METERING VAPORS CONTAINED IN THE ATMOSPHERE

[75] Inventor: Michel Tircot, Leuville sur Orge, France

[73] Assignee: Commissariat a l'Energie Atomique, Paris, France

[21] Appl. No.: 497,187

[22] Filed: May 23, 1983

[30] Foreign Application Priority Data

Jun. 10, 1982 [FR] France ............... 82 10123

[51] Int. Cl.³ ........................... F25B 21/02
[52] U.S. Cl. .................................. 62/3
[58] Field of Search ............................. 62/3

[56] References Cited

U.S. PATENT DOCUMENTS

| | | | |
|---|---|---|---|
| 2,779,172 | 1/1957 | Lindenblad | 62/3 |
| 2,919,553 | 1/1960 | Fritts | 62/3 |
| 2,944,404 | 7/1960 | Fritts | 62/3 |
| 3,506,543 | 4/1970 | Hayes et al. | 203/10 |
| 3,740,959 | 6/1973 | Foss | 62/3 |
| 4,315,599 | 2/1982 | Biancardi | 62/3 X |

FOREIGN PATENT DOCUMENTS

| | | |
|---|---|---|
| 1166596 | 11/1958 | France . |
| 1353296 | 1/1964 | France . |
| 2472733 | 12/1979 | France . |
| 404141 | 7/1966 | Switzerland . |
| 900043 | 7/1962 | United Kingdom . |

Primary Examiner—Lloyd L. King
Attorney, Agent, or Firm—Oblon, Fisher, Spivak, McClelland & Maier

[57] ABSTRACT

Apparatus for the continuous metering of the vapors contained in the atmosphere.

It comprises a thermoelectric module subject to the Peltier effect, which is supplied with electric power and whose hot face is in contact with a heat-dissipating radiator and whose cold face is in contact with a thermally insulated condensation chamber in which circulates the atmosphere charged with the vapors to be condensed, said chamber having a conductive metal structure provided with perforated ribs, the flow of the atmosphere and the temperature being permanently controlled at values such that the condensed vapor remains in the liquid state, the liquid condensate obtained flowing by gravity into the lower part of the chamber which, for this purpose, has a liquid phase discharge port.

3 Claims, 1 Drawing Figure

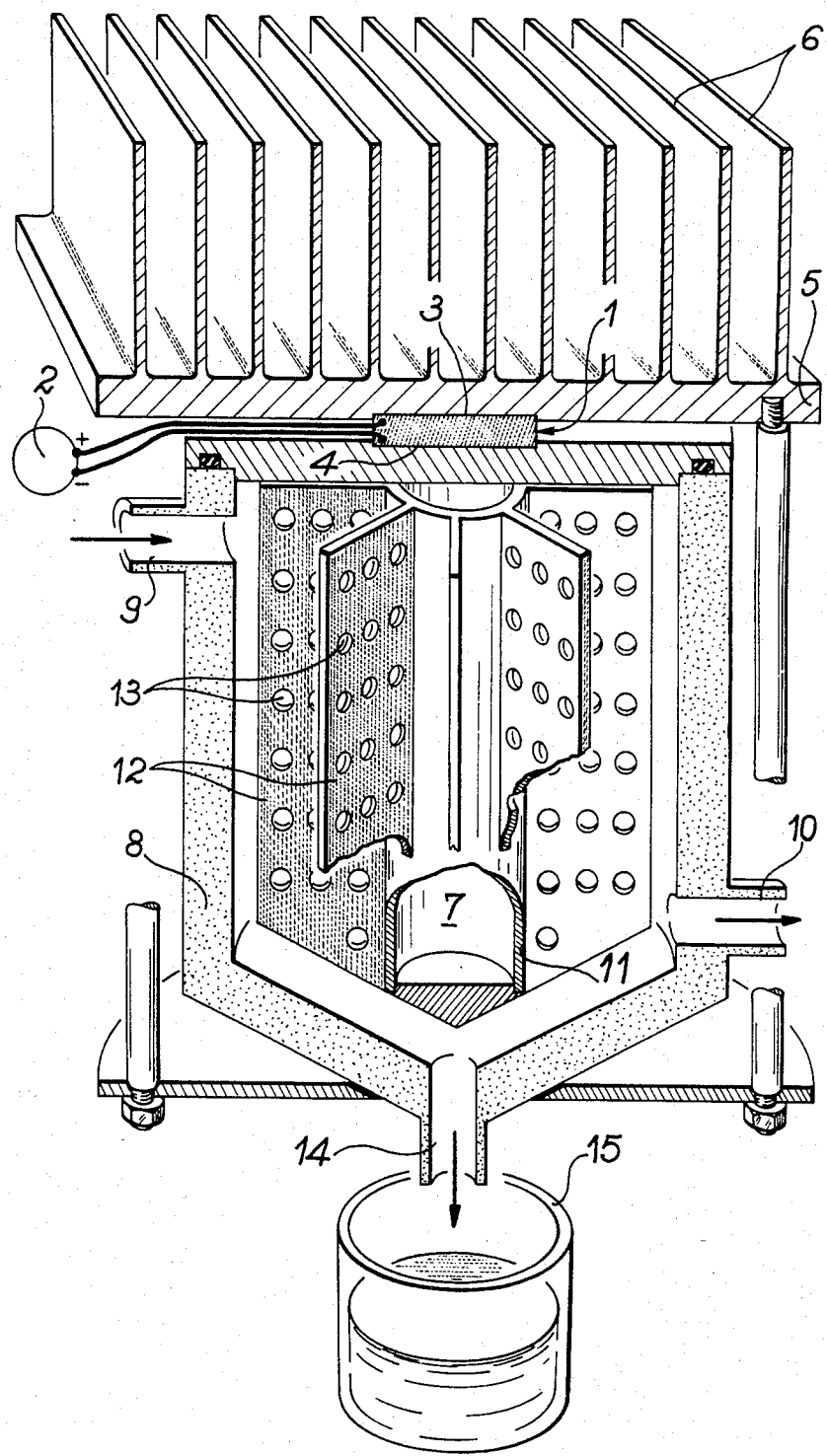

APPARATUS FOR CONTINUOUSLY METERING VAPORS CONTAINED IN THE ATMOSPHERE

BACKGROUND OF THE INVENTION

The present invention relates to the field of metering the vapours contained in a given atmosphere, by condensation in contact with a cold source.

It particularly, but not exclusively, applies to the case of the continuous determination of the water content of the atmosphere and is used with particular advantage when it is a question of monitoring, in the vicinity of nuclear installations which can lead to radioactive pollution, the content of radioactive constituents in the water of the atmosphere. Thus, for example, use is presently made thereof in the determination of the tritiated water content of the earth's atmosphere in the vicinity of certain nuclear installations.

The industry is already aware of certain equipment making it possible, by condensation, in contact with a cold source, of the vapours contained in the atmosphere, to identify and meter said vapours.

Thus, equipment is known, which traps the vapours by solid carbon dioxide, but suffer from the disadvantage of requiring a permanently replenishable stock of solid carbon dioxide for ensuring their satisfactory operation.

In other known equipment, use is made of ordinary refrigerating units, in which the atmosphere containing the vapours to be condensed plays on the cooled walls of said unit. This type of apparatus has the serious disadvantage caused by the fact that, after a certain time, the ice which forms on the walls constitutes an obstacle to the transmission of the cold fluid and rapidly reduces the efficiency of the installation after a few hours. Moreover, such equipment only functions discontinuously and is not very practical, because someone must be permanently present to recover the hoar frost which forms on the walls.

Equipment is also known, which traps the water vapour in the air by effecting its bubbling in an aqueous solution. These systems have the disadvantage of being limited both with respect to the flow rate and the operating period, whilst also requiring daily maintainance.

BRIEF SUMMARY OF THE INVENTION

The present invention relates to an apparatus for continuously metering the vapours contained in an atmosphere and which makes it possible to obviate the prior art difficulties referred to hereinbefore, whilst offering the advantage of virtually no maintainance and the possibility of very long sampling operations.

The present invention therefore relates to an apparatus for the continuous metering of vapours contained in the atmosphere, of the type in which said atmosphere is circulated in contact with a cold source leading to the condensation of the vapours, wherein it comprises a thermoelectric module subject to the Peltier effect, which is supplied with electric power and whose hot face is in contact with a heat-dissipating radiator and whose cold face is in contact with a thermally insulated condensation chamber in which circulates the atmosphere charged with the vapours to be condensed, said chamber having a conductive metal structure provided with perforated ribs, the flow of the atmosphere and the temperature being permanently controlled at values such that the condensed vapour remains in the liquid state, the liquid condensate obtained flowing by gravity into the lower part of the chamber which, for this purpose, has a liquid phase discharge port.

The use, according to the invention, of a Peltier effect thermoelectric module as the cold source, makes it possible to accurately regulate the temperature to the desired value for obtaining condensation and for automatically overcoming the difficult problems caused by the icing up of the walls in the prior art equipment.

According to the invention, the Peltier effect thermoelectric module in the condensation means is constituted by a system of thermocouples formed by stacked plates of a quaternary alloy of bismuth, tellurium, selenium and antimony, supplied with a voltage of 10 V and traversed by a current intensity of approximately 5 A.

It is clear that the electrical supply characteristics of the apparatus (voltage 10 V, current intensity 5 A) make it possible to use a standard power supply, which is also an important advantage of the invention.

Finally, it is often, but not necessarily advantageous to make the temperature in the condensation chamber very close to 0° C. which, as stated hereinbefore, makes it possible to reconcile good condensation of the vapours with an almost complete absence of icing up.

DESCRIPTION OF THE DRAWING AND PREFERRED EMBODIMENT

The invention will be better understood from the following description of an apparatus for condensating the water in the atmosphere and then used for determining the tritiated water content thereof. In the drawing, the Peltier effect thermoelectric module 1 is supplied by a direct current source 2 and, in accordance with the very principle of such means, has a hot face 3 and a cold face 4. The direct current supply 2 can supply 8 A, under 15 V, e.g. from a rectified power supply using the 220 V a.c. mains.

The hot face 3 of the thermoelectric module 1 is in direct contact with a thermal energy dissipation radiator 5, equipped with ribs 6 located in the atmosphere to which they give off the calories developed on said hot face 3. If necessary, a fan, not shown in the drawing, accelerates the heat exchange between radiator 5 and ribs 6 on the one hand and the atmosphere in which the apparatus is located on the other.

According to the invention, the cold face 4 of thermoelectric module 1 is turned towards the interior of a condensation chamber 7, surrounded by thermal insulation 8 and traversed by a current of the atmosphere to be examined, which enters the upper part 9 of chamber 7 and leaves the latter via its lower part 10. Within chamber 7 and in thermal contact with the cold face 4 of the thermoelectric module 1, there is a conductive metal structure made from copper in the present embodiment, and which on an axial copper cylinder 11 has a certain number of ribs 2, perforated by holes 13, permitting the circulation within the condensation chamber 7 of the atmosphere which is to be tested with respect to the vapours contained therein. In the present embodiment, there are eight ribs 12 and are perforated by holes 13 with a diameter of 4 mm, in order to increase the passage of the gaseous atmosphere and the exchange surface within the condensation chamber 7.

In its lower part, condensation chamber 7 has a discharge port 14, by which the liquid condensate formed in contact with the cold metal structure 11 flows dropwise to the outside. If, under these conditions, it is wished to analyze the condensate obtained, it is merely necessary to collect it in a receptacle such as 15.

In the present embodiment, the Peltier effect thermoelectric module 1 comprises stacked plates of a quaternary alloy of bismuth, tellurium, selenium and antimony. The circulation of the atmosphere to be controlled between its inlet 9 and its outlet 10 of condensation chamber 7 is forced with the aid of a not shown pump and whose flow rate can be e.g. approximately 15 l/min.

Condensation chamber 7 has a not shown thermometer probe making it possible to check and, if desired, control the temperature within the same. A value which is appropriate for the satisfactory operation of the apparatus is approximately 0° C., which ensures an optimum water volume yield (which must remain liquid), compared with the air volume (15 l/min.) allowed to enter condensation chamber 7.

The thus described apparatus is used for determining the tritium content of the water in the atmosphere and can operate continuously without manual intervention and with virtually no maintainance.

What is claimed is:

1. An apparatus for the continuous metering of the vapours contained in the atmosphere of the type in which said atmosphere is circulated in contact with a cold source, leading to the condensation of the vapours, wherein it comprises a thermoelectric module subject to the Peltier effect, which is supplied with electric power and whose hot face is in contact with a heat-dissipating radiator and whose cold face is in contact with a thermally insulated condensation chamber in which circulates the atmosphere charged with the vapours to be condensed, said chamber having a conductive metal structure provided with perforated ribs, the flow of the atmosphere and the temperature being permanently controlled at values such that the condensed vapour remains in the liquid state, the liquid condensate obtained flowing by gravity into the lower part of the chamber which, for this purpose, has a liquid phase discharge port.

2. A condensation apparatus according to claim 1, wherein the Peltier effect thermoelectric module is constituted by a system of thermocouples formed by stacked plates of a quaternary alloy of bismuth, tellurium, selenium and antimony, supplied under a voltage of 10 V and traversed by a current intensity of 5 A.

3. An apparatus according to claim 1, wherein the temperature within the condensation chamber is controlled at approximately 0° C.

* * * * *